United States Patent
Jang

(10) Patent No.: US 11,409,319 B2
(45) Date of Patent: Aug. 9, 2022

(54) MULTI-FUNCTIONAL KNOB

(71) Applicant: HYUNDAI MOBIS CO., LTD., Seoul (KR)

(72) Inventor: KilPyung Jang, Seoul (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 17/382,269

(22) Filed: Jul. 21, 2021

(65) Prior Publication Data

US 2022/0050490 A1 Feb. 17, 2022

(30) Foreign Application Priority Data

Aug. 13, 2020 (KR) .................. 10-2020-0101742

(51) Int. Cl.
| | |
|---|---|
| G05G 1/10 | (2006.01) |
| H03J 5/04 | (2006.01) |
| G05G 5/04 | (2006.01) |
| G05G 1/02 | (2006.01) |
| H03J 5/10 | (2006.01) |

(52) U.S. Cl.
CPC .................. *G05G 1/10* (2013.01); *G05G 1/02* (2013.01); *G05G 5/04* (2013.01); *H03J 5/04* (2013.01); *H03J 5/10* (2013.01)

(58) Field of Classification Search
CPC .. G05G 1/02; G05G 1/08; G05G 1/10; G05G 1/12; G05G 5/04; G05G 5/12; G05G 5/20; H03J 5/04; H03J 5/10
See application file for complete search history.

(56) References Cited

U.S. PATENT DOCUMENTS

| | | | | |
|---|---|---|---|---|
| 3,982,442 | A * | 9/1976 | Shiurila | G05G 1/12 74/89.45 |
| 7,414,205 | B1 * | 8/2008 | Heinrich | H01H 19/63 200/336 |
| 9,372,498 | B2 * | 6/2016 | Fust | G05G 1/08 |
| 9,557,761 | B2 * | 1/2017 | Sönmez | G05G 1/08 |
| 9,559,649 | B2 * | 1/2017 | Noh | H04R 1/00 |
| 10,150,223 | B2 * | 12/2018 | Michel | G05G 1/08 |
| 2011/0061489 | A1 * | 3/2011 | Bulin | G05G 1/12 74/553 |

FOREIGN PATENT DOCUMENTS

| | | | | | |
|---|---|---|---|---|---|
| CN | 109455062 | A | * | 3/2019 | .......... B60H 1/0065 |
| DE | 102014222200 | B3 | * | 1/2016 | .............. G05G 1/08 |
| KR | 19980011998 | U | * | 5/1998 | |
| KR | 19980029014 | U | * | 8/1998 | |
| KR | 20100001424 | A | * | 1/2010 | |
| KR | 20100038721 | A | * | 4/2010 | |
| KR | 20210070021 | A | * | 6/2021 | |
| WO | WO-03085477 | A1 | * | 10/2003 | .............. G05G 1/02 |
| WO | WO-2014177631 | A2 | * | 11/2014 | .......... B60H 1/0065 |

* cited by examiner

*Primary Examiner* — Adam D Rogers
(74) *Attorney, Agent, or Firm* — DLA Piper LLP (US)

(57) ABSTRACT

A multi-functional knob comprising: a button unit exposed to the outside and having a gripping circumferential surface; a guide body unit of a hollow type, configured such that the button unit surrounds at least a portion thereof and is fixedly coupled to an outer surface thereof; a fixing housing of a hollow type, at least partially surrounding the button unit and the guide body unit; a push member assembled to the fixing housing and configured to move in a direction parallel to a longitudinal axis in response to movement of the guide body unit; and a printed circuit board connected to the fixing housing.

15 Claims, 8 Drawing Sheets

MULTI-FUNCTIONAL KNOB

CROSS-REFERENCE TO RELATED APPLICATIONS

This application is based on, and claims priority from, Korean Patent Application Number 10-2020-0101742, filed Aug. 13, 2020, the disclosure of which is incorporated by reference herein in its entirety.

TECHNICAL FIELD

The present disclosure relates to a multifunction knob. More specifically, the present invention relates to a multifunctional knob for adjusting a device function of a vehicle or the like.

BACKGROUND

The content described in this section merely provides background information for the present disclosure and does not constitute prior art.

In order for a driver to operate a desired function while keeping attention for driving, a center fascia of a vehicle is usually provided with a user interface for operating devices such as an air conditioning control panel, car audio, navigation, and display.

These user interfaces are implemented in the form of various input means, such as a knob in a rotary dial form, a push button and a touch pad.

Spatial difficulties are being weighted in arranging input means for operating such functions, and operational difficulty is increasing in using such input means.

In the meantime, the appearance design of in-vehicle input means becomes an important factor in making the interior design of the vehicle. However, the mechanical tolerance margin of the input means is quite limited, since the manipulation feels given to the user when using it is also a factor of the important sensitivity quality. The flexibility in which the design of the input means can be changed in order to reflect the desired design element can also be limited due to this tolerance margin, and even within the limited range, there is a problem that the manufacturing cost is increased for the design change.

SUMMARY

Technical Problem

Accordingly, the present disclosure is intended to solve these problems, and a main object thereof is to provide a multi-function knob with improved ease of use and design freedom without an increase in manufacturing costs.

Technical Solution

According to an embodiment of the present disclosure for achieving this object, there is provided a multi-functional knob comprising: a button unit exposed to the outside and having a gripping circumferential surface; a guide body of a hollow type, configured such that the button unit surrounds at least a portion thereof and is fixedly coupled to an outer surface thereof; a fixing housing of a hollow type, at least partially surrounding the button unit and the guide body unit; a push member assembled to the fixing housing and configured to move in a direction parallel to a longitudinal axis in response to movement of the guide body unit; and a printed circuit board connected to the fixing housing.

Advantageous Effects

As described above, according to the present embodiment, it is possible to provide a multi-function knob with improved usability and design freedom without an increase in manufacturing costs.

DETAILED DESCRIPTION

Figure 1:
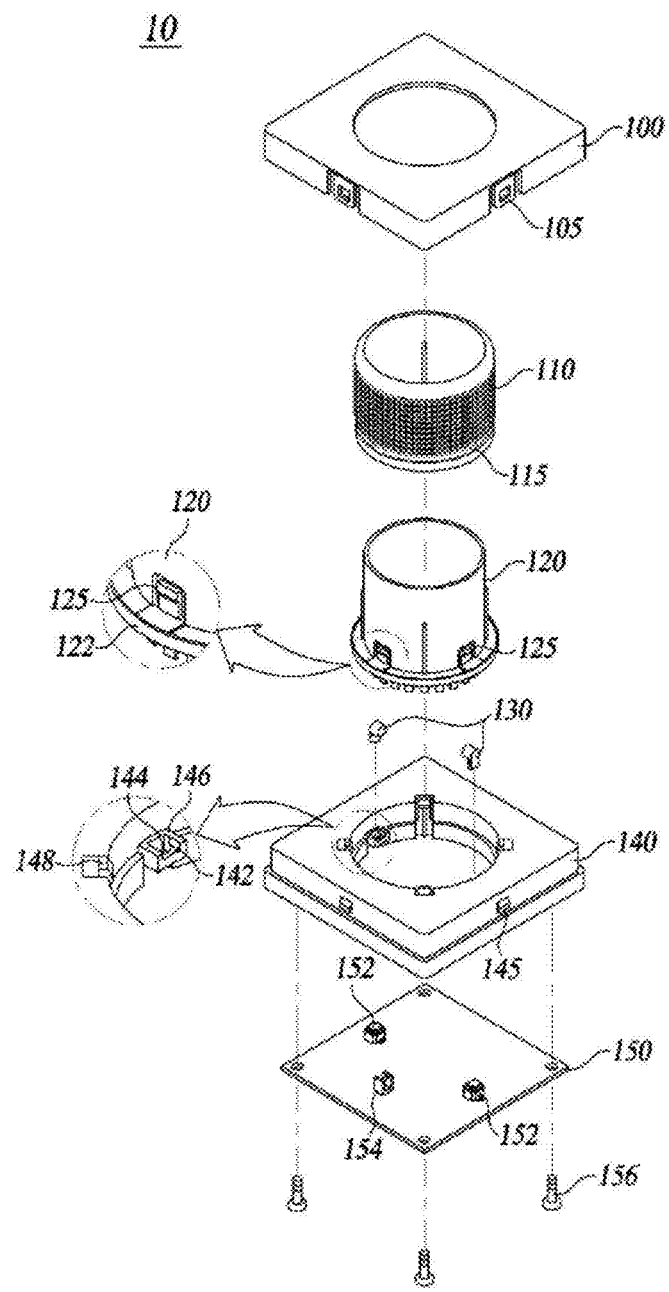
FIG. 1 is an exploded perspective view of a multifunction knob according to an embodiment of the present disclosure.

Some embodiments of the present disclosure will now be described in detail with reference to the illustrative drawings. It should be noted that, when reference numerals are added to the components in each drawing, the same components have the same numerals as possible, even if they are shown on different drawings. In the description of the present disclosure, a detailed description of a related known configuration or function is omitted when it is determined that the gist of the disclosure can be made.

In describing the components of the embodiments according to the present disclosure, reference numerals such as first, second, i), ii), a), and b) may be used. Such symbols are only for distinguishing the components from other components, and the nature or order of the components is not limited by the symbols. When a portion in the specification is referred to as "comprising" or "including" a component, it means that the component may further comprise other components rather than excluding other components unless explicitly stated to the contrary.

FIG. 1 is an exploded perspective view of a multifunction knob according to an embodiment of the present disclosure.

Figure 2:
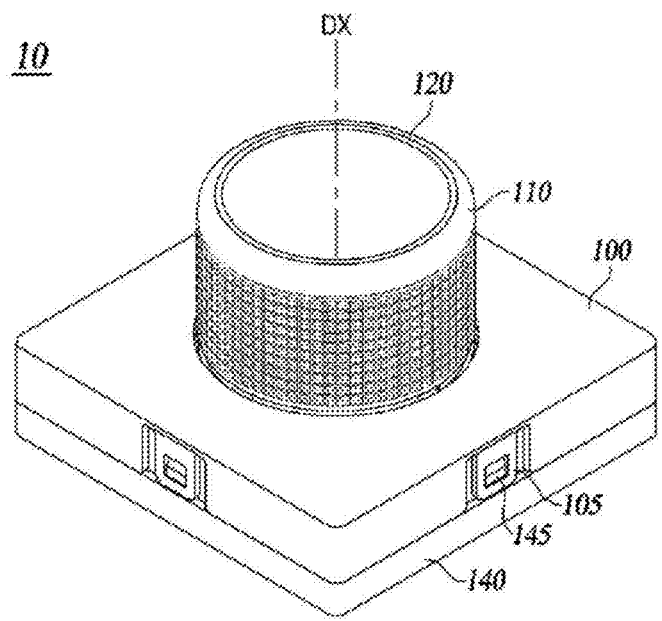
FIG. 2 is a perspective view of a multifunction knob having completed assembly in accordance with an embodiment of the present disclosure.

FIG. 2 is a perspective view of a multifunction knob having completed assembly in accordance with an embodiment of the present disclosure.

Figure 3:
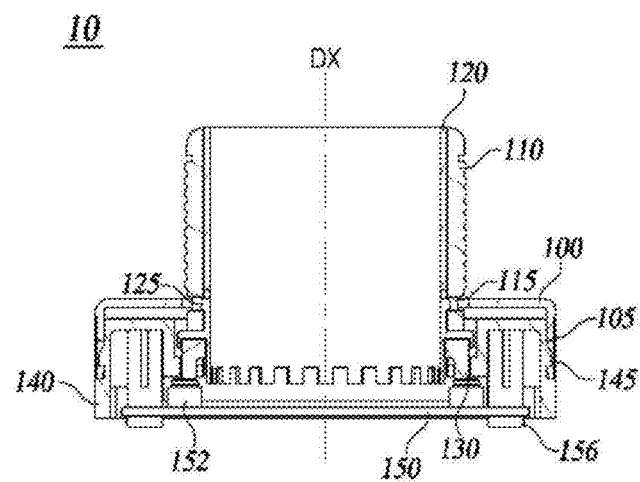
FIG. 3 is a cross-sectional view of a multifunction knob completed assembly in accordance with an embodiment of the present disclosure.

FIG. 3 is a cross-sectional view of a multifunction knob completed assembly according to an embodiment of the present disclosure.

Referring to FIGS. 1-3, a multifunction knob according to an embodiment of the present disclosure may include all or part of a button unit 110, a guide body unit 120, a fixing housing 140, a push member 130, a printed circuit board 150, and a cover housing 100.

The button unit 110 is exposed to the outside and has a gripping circumferential surface. Since the button unit 110 is exposed to the outside, it serves as an external component and serves as a medium for transmitting the force applied by the user while serving as an indoor interior of the automobile. A user of a multi-functional knob according to an embodiment of the present disclosure may change the state of the vehicle by rotating or pressing the externally exposed button unit 110 in the longitudinal direction DX.

Accordingly, the button unit 110 may be configured to be movable along the longitudinal axis direction DX of the multi-functional knob according to an embodiment of the present disclosure, and may also be configured so as to be able to rotate about the longitudinal axis DX of the multi-functional knob according to an embodiment of the present disclosure. The user may adjust an air condition, volume, radio frequency, etc. inside the vehicle, for example, by operating the multi-functional knob according to an embodiment of the present disclosure.

The guide body unit 120 is of a hollow type such that the button unit 110 is fixedly coupled to the peripheral surface while surrounding at least a portion thereof. Accordingly, the guide body unit 120 may be configured to move in conjunction with each other according to the direction of movement of the button unit 110. That is, when the button unit 110 moves in the longitudinal axis direction DX, the guide body unit 120 also moves together in the vertical axis direction DX. When the buttons portion 110 rotates about the longitudinal axis DX as the rotation axis, the guide body unit 120 can also rotate about the longitudinal axis DX as the rotation axis. When the button unit 110 and the guide body unit 120 are moved in conjunction with each other, it is possible to directly transmit the movement of the buttons portion 110 to the guiding body portion 120. However, the button unit 110 and the guide body unit 120 need not necessarily be moved in conjunction with each other, but may be configured such that the button units 110 and guide body units 120 are individually movable depending on purposes and uses.

The fixing housing 140 is of a hollow type to at least partially surround the button unit 110 and the guide portion 120. The button unit 110 and the guide body unit 120 are coupled to the fixing housing 140, except that the button units 110 and guide body units 120 are movable in the longitudinal direction DX and are rotatably coupled about the longitudinal axis DX.

Meanwhile, the fixing housing 140 may include a first hook assembly 145 for engaging with the cover housing 100, and the first hook assembly 145 may be configured four by four at 90° intervals along the outer circumferential surface of the fixing housing 140, but is not limited to this number.

The push member 130 is assembled to the fixing housing 140 and is configured to move in a direction parallel to the longitudinal axis in response to movement of the guide body unit 120. That is, the push member 130 serves as a medium for transmitting a force in accordance with the movement of the guide body unit 120 to the sensor. As will be described in detail with respect to the movement of the push member 130, when the guide body unit 120 moves in the longitudinal direction DX, it is moved in a direction parallel to the longitudinal axis together with the guiding body portion 120. However, when the guide body unit 120 rotates about the longitudinal axis direction DX, the push member 130 is configured to move in a direction parallel to the vertical axis in accordance with the rotation of the guide body unit 120. This causes the push member 130 to move in a direction parallel to the longitudinal axis even when the guide body unit 120 moves in the longitudinal direction DX or rotates about the vertical axis DX as the rotational axis.

Hereinafter, a motion in which the button unit 110 and the guide body unit 120 rotate about the longitudinal axis DX by a user rotating the multi-functional knob according to an embodiment of the present disclosure will be referred to a rotation axis. Further, a case where the button unit 110 and the guide body unit 120 are moved in the longitudinal axis direction DX by the user pressing the multi-functional knob according to an embodiment of the present disclosure, and a case in which the push member 130 is moved in a direction parallel to a longitudinal axis by a user rotating the multi-functional jack according to the embodiment of this disclosure are referred to linear movement.

The printed circuit board 150 is connected to the fixing housing 140. The printed circuit board 150 and the fixing housing 140 may be fastened using bolt 156, but are not necessarily limited thereto. The printed circuit board 150 is connected to the fixing housing 140 and serves to convert an input value according to a straight line or rotation of the guide body unit 120 into an electrical signal.

The printed circuit board 150 may include all or part of a push sensor 152 and a rotation sensor 154 to convert an input value according to a straight line or rotation of the guide body unit 120 into an electrical signal.

The push sensor 152 is configured so that one end thereof is fixed to the printed circuit board 150 and the other end thereof can be pressed by the push member 130, i.e., it can sense movement in the direction parallel with the longitudinal axis. Therefore, when the guide body unit 120 is linearly moved or rotated, the push member 130 is made to make a linear motion, and the push member 130 presses the other end of the push sensor 152, so that the push sensor or pressure-sensitive sensor 152 converts the input value into an electrical signal. The push sensor 152 may be configured to use, for example, but not necessarily limited to, a tact switch.

One or a plurality of push sensors 152 may be fixed to the printed circuit board 150. When there are a plurality of push sensors 152, the printed circuit board 150 may include a control unit (not shown) to convert only one of the plurality of input values into an electrical signal.

In the meantime, the other end of the push sensor 152 is formed such that a force returning to the initial position, i.e., a restoring force, is generated. Therefore, when the user depresses the multifunction knob in accordance with an embodiment of the present disclosure, the multi-functional knob returns to the initial position.

The rotation sensor 154 is configured such that one end thereof is fixed to the printed circuit board 150, and the other end thereof is capable of sensing the rotational movement of the guide body unit 120. For example, the rotation sensor 154 may be configured using a photo sensor having a 'U' shape and configured such that an end part of the guide body unit 120 is positioned between the 'U'-shaped curvatures of the rotation sensor 154.

One or a plurality of rotation sensors 154 may be fixed to the printed circuit board 150. When there are a plurality of rotation sensors 154 as with the push sensor 152, the control unit included in the printed circuit board 150 may convert only one of the plurality of input values into an electric signal.

The cover housing 100 is configured to be fixed to the fixing housing 140 while covering at least a part of the outside of the fixing housing 140. Therefore, the cover housing 100 is exposed to the outside and serves to protect the components inside the cover housing 100 while at the same time providing interior design in the interior of the automobile.

Meanwhile, the cover housing 100 may include a first assembly hole 105 for coupling with the first hook assembly 145. The first assembly holes 105 are preferably configured in the same number as the number of the first hook assembly 145, and may be configured in four at 90° intervals along the outer peripheral surface of the cover housing 100, but this number is not necessarily limited thereto.

The multi-functional knob according to an embodiment of the present disclosure includes all or part of the above configuration, so that both linear movement and rotational movement are possible. In addition, the design of the cover housing 100 and the button unit 110 exposed to the outside can be freely changed, so that a manufacturer according to the design change can satisfy the user's preference without increasing cost.

Figure 4:
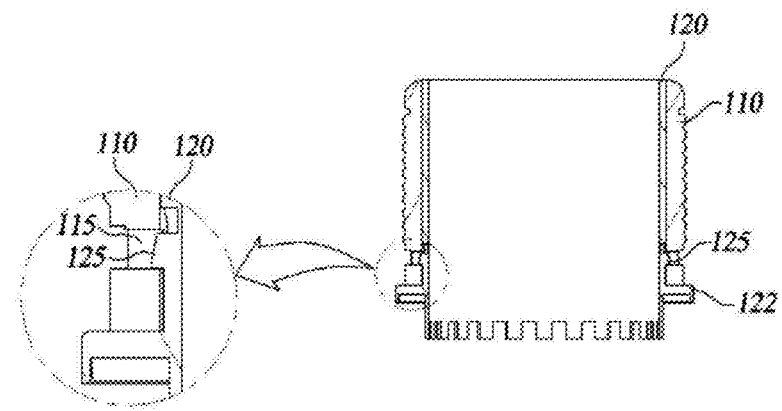
FIG. 4 is a cross-sectional view for explaining the engagement relationship between the button unit and the guide body unit of the multi-functional knob according to an embodiment of the present disclosure.

FIG. 4 is a cross-sectional view for explaining a coupling relationship between the button unit 110 and the guide body unit 120 of the multi-functional knob according to an embodiment of the present disclosure.

Referring to FIGS. 1 and 4, the guide body unit 120 of the multifunction knob according to an embodiment of the present disclosure may include a second hook assembly 125 for engaging the button unit 110. The button unit 110 may also include a second hole assembly 115 for engaging the second hook assembly 125. The second hook assembly 125 and the second assembly hole 115 may be configured in four by four at 90° intervals, for example, but are not necessarily limited to this number.

Figure 5:
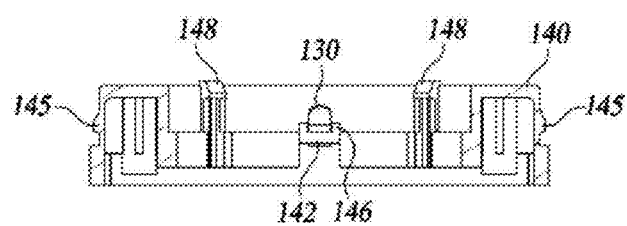
FIG. 5 is a cross-sectional view in which a part of the configuration is omitted to describe the engagement relationship between the fixing housing and the push member of the multi-functional knob according to an embodiment of the present disclosure.

FIG. 5 is a cross-sectional view in which some configurations are omitted to describe the engagement relationship between the fixing housing 140 and the push member 130 of the multi-functional knob according to an embodiment of the present disclosure.

Referring to FIG. 5, a multifunction knob according to an embodiment of the present disclosure may include a movement preventing unit 142.

The movement preventing unit 142 is included in the fixing housing 140, and is configured to prevent the push member 130 from moving in a direction other than a direction parallel to the longitudinal axis. Therefore, the assembly groove 144 can be configured such that the push member 130 can move in a direction parallel to the longitudinal axis while the movement preventing unit 142 is assembled with the push member 130. Meanwhile, the movement preventing unit 142 may be configured such that a movement preventing unit 146 is formed along the circumferential surface of the push member 130 in order to prevent the push member 130 from moving in a direction other than a direction parallel to the longitudinal axis. However, the movement preventing unit 146 need not necessarily be disposed so as to surround all of the circumferential surface of the push member 130, and may be disposed to surround only a part of the circumference surface of a push member 130 as long as it is not moved in a direction other than the direction parallel to the longitudinal axis.

In the meantime, when the push member 130 is accommodated in the movement preventing unit 142, since the push member 130 moves in a direction parallel to the longitudinal axis in accordance with the movement of the guide body unit 120, it is preferable to apply lubricating oil to the push members 130 in order to prevent a problem of noise generation and poor operation feeling due to friction with the guide bodies 120. However, the lubricating oil may not necessarily be applied only to the push member 130, but may be applied to other positions as long as the occurrence of noise is expected. The push member 130 is made of a material having a relatively small coefficient of friction, for example, a plastic material.

Figure 6:
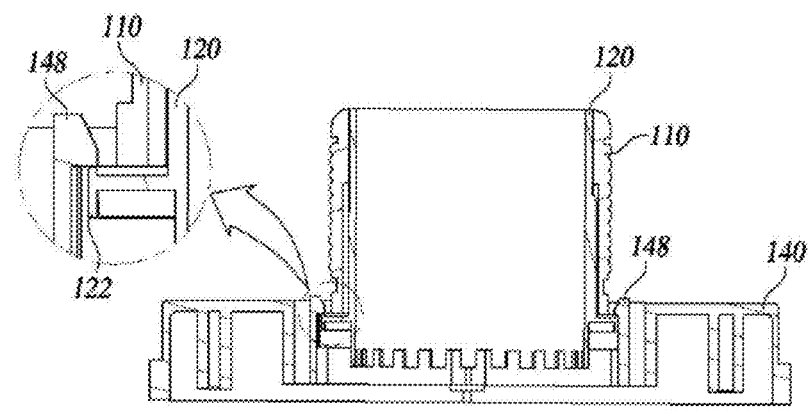
FIG. 6 is a cross-sectional view for explaining a coupling relationship between a fixing housing and a guide body unit of a multi-functional knob according to an embodiment of the present disclosure.

FIG. 6 is a cross-sectional view for explaining a coupling relationship between the fixing housing 140 and the guide body unit 120 of the multi-functional knob according to an embodiment of the present disclosure.

Referring to FIG. 6, the fixing housing 140 and the guide body unit 120 of the multi-functional knob according to an embodiment of the present disclosure may include a fixing hook 148 and a contact curvature unit 122, respectively.

The fixing hook 148 is included in the fixation housing 140 and constrains the range in which the guide body unit 120 is movable in the longitudinal direction DX. That is, the fixing hook 148 is configured such that the guide body unit 120 is movable in the longitudinal direction DX only within a predetermined range. This is to prevent the guide body unit 120 from being detached from the fixing housing 140 when the user operates the multi-functional knob according to an embodiment of the present disclosure. The number of fixing hooks 148 may be, for example, but not necessarily limited to, four each at 90° intervals.

The contact surface portion 122 may be included in the guide body unit 120 and configured to at least partially point contact with the fixing hook 148. This is to minimize the frictional force generated by the contact surface portion 122 coming into contact with the fixing hook 148 when the guide body unit 120 is rotated, and to prevent the rotational operation feeling from being mitigated due to the friction between the fixing hook 148 and the contact tip portion 122.

Figure 7:
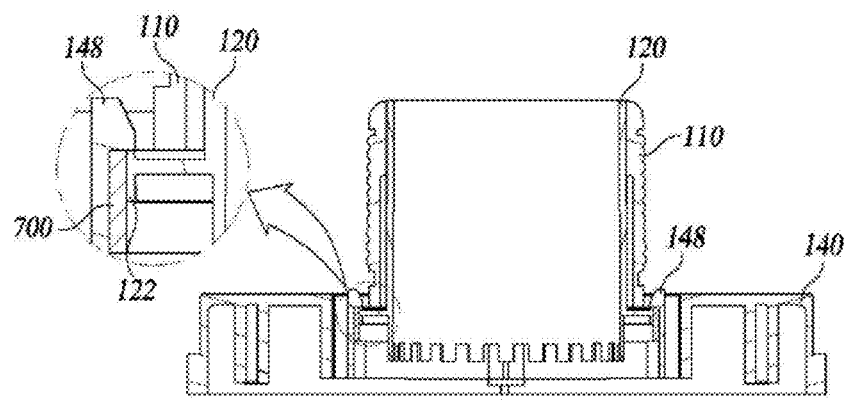
FIG. 7 is a cross-sectional view for explaining the coupling relationship between the fixing housing and the guide body unit of the multi-functional knob according to another embodiment of the present disclosure.

FIG. 7 is a cross-sectional view for explaining the engagement relationship between the fixing housing 140 and the guide body unit 120 of the multi-functional knob in accordance with another embodiment of the present disclosure.

Referring to FIG. 7, a multifunction knob according to an embodiment of the present disclosure may further include an anti-shaking unit 700.

The anti-shaking unit 700 is disposed between the fixing hook 148 and the abutting curved surface portion 122 and configured to keep the rotation axis of the guide body unit 120 constant. When the guide body unit 120 is rotated, and is moved in a direction perpendicular to the axis of rotation, the input value of the rotation of the guide bodies 120 measured by the rotation sensor 154 may vary. Therefore, in the case where the guide body unit 120 rotates, it is preferable to use the anti-shaking unit 700 to prevent the guide head portion 120 from moving in a direction perpendicular to the rotation axis, that is, the longitudinal axis.

Meanwhile, the abutting curved surface portion 122 may be configured to be at least partially in line contact with the anti-shaking unit 700. This is to minimize the frictional force caused by the abutting curved surface portion 122 abutting against the anti-shaking unit 700 when the guide body unit 120 rotates.

Figure 8:
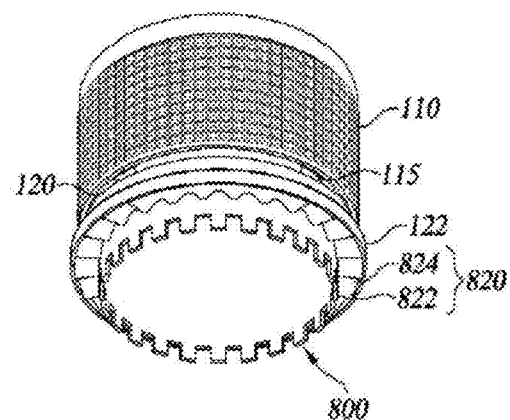
FIG. 8 is a perspective view for illustrating a shape of a guide body unit according to an embodiment of the present disclosure.

FIG. 8 is a perspective view for illustrating a shape of a guide body unit 120 according to an embodiment of the present disclosure.

Figure 9:
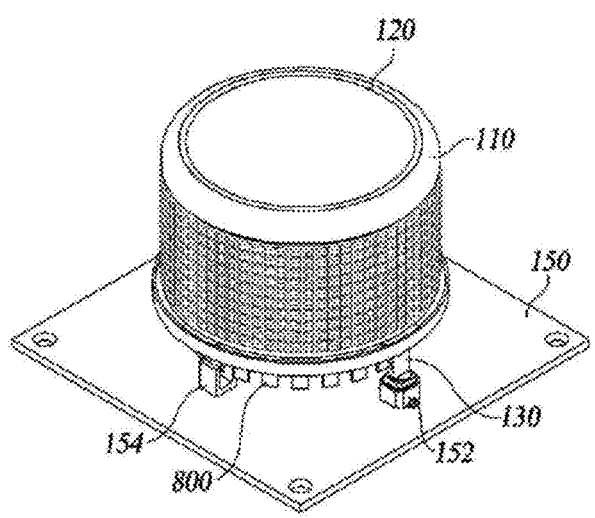
FIG. 9 is a perspective view in which some configurations are omitted to illustrate a method in which the push sensor and the rotation sensor of the multi-functional knob sense movement of the guide body unit according to an embodiment of the invention.

FIG. 9 is a perspective view of a multi-functional knob with some configurations omitted to illustrate how the push sensor 152 and the rotation sensors 154 sense the movement of the guide body unit 120 according to an embodiment of this disclosure.

Figure 10:
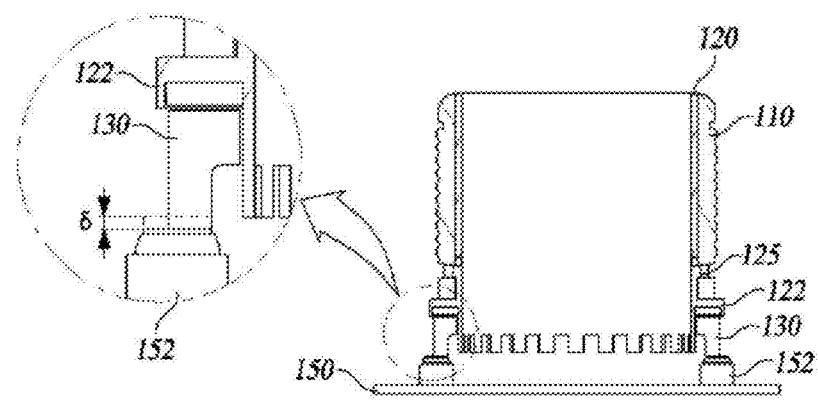
FIG. 10 is a cross-sectional view illustrating a positional relationship between the push member and the push-sensing sensor of the multi-functional knob according to an embodiment of the present disclosure with some configurations omitted.

FIG. 10 is a cross-sectional view in which some configurations are omitted to describe the positional relationship between the push member 130 and the push sensor 152 of the multi-functional knob according to an embodiment of the present disclosure.

Referring to FIGS. 8 to 10, the guide body unit 120 of the multifunction knob according to an embodiment of the present disclosure includes all or a portion of a plurality of uneven structures 800 and a number of rotary guide units 820. The uneven structures 800 may be uneven structures.

A plurality of uneven structures 800 are included in the guide body unit 120 and are arranged along a circumferential direction at an end portion thereof. Each of the uneven structures 800 is preferably disposed at regular intervals along the circumferential direction of the end portion of the guide body unit 120.

Further, the plurality of uneven structures 800 are configured to block the light generated from the rotation sensor 154. That is, when the guide body unit 120 is coupled to the fixing housing 140, the plurality of uneven structures 800 are configured to be positioned between the bends, e.g., 'U'-shaped bends, of the rotation sensor 154 to block the light emitted between the 'U'-shaped bends generated by the rotation sensor 154.

As the guide body unit 120 rotates, a plurality of relief structures 800 block the light generated from the rotation sensor 154 at regular intervals. Meanwhile, a portion of the end of the guide body unit 120 where the plurality of uneven structures 800 are not formed is prevented from blocking the light generated by the rotation sensor 154. If the light is not blocked, the light passes between the bends of the rotation sensor 154, at the time of which the rotation sensor 154 may obtain an input value. Therefore, it is also possible to detect the number of times the light passes and to know how much the guide body unit 120 has rotated.

When the guide body unit 120 is in linear motion, the plurality of asperities 800 continue to block the light generated from the rotation sensor 154. That is, since the range in which the guide body unit 120 is movable in the longitudinal direction DX is limited by the fixing hook 148, within a predetermined range, the plurality of uneven structures 800 may be configured to always block the light generated from the rotation sensor 154. Therefore, the linear movement of the guide body unit 120 does not affect the input value obtained by the rotation sensor 154.

A plurality of rotary guide units 820 are disposed along the circumferential surface of the guide body unit 120. Each of the rotary guide units 820 is preferably disposed at regular intervals along the circumferential surface of the guide body unit 120.

In addition, at least a portion of the push member 130 may slidably contact with the rotary guide unit 820. That is, when the guide body unit 120 is coupled to the fixing housing 140, the plurality of rotary guide units 820 are configured to abut against the push member 130, and the push member 130 can slide on the rotary guide unit 820 in accordance with the rotation of the guiding body portion 120.

When the guide body unit 120 is linearly moved, the plurality of rotary guide units 820 push the push member 130 in a direction parallel to the longitudinal axis, and the push member 130 pushes the other end of the push sensor 152 again, thereby obtaining the input value. Here, the minimum pressing length and the minimum force for the push sensor 152 to obtain the input value can be easily changed by changing the setting, so that the user can be satisfies with a desired pressing operation feeling.

Meanwhile, referring to FIG. 10, even in a state where the user does not manipulate the multi-functional knob according to an embodiment of the present disclosure, the push member 130 may be configured to overlap the push sensor 152 by a predetermined length in a direction parallel to the longitudinal axis. Since the other end of the push sensor 152 is configured to return to the initial position when no force is applied, the push member 130 is subject to an elastic force proportional to the predetermined length from the push sensor 152 when the push member 130 pushes the other of the push sensors 152 by a predetermined length 6, for example, 0.2 mm. As a result, the push member 130 is subject to a compressive force by the rotary guide unit 820 and the push sensor 152, so that it is possible to prevent itself from being moved due to the vibration of the vehicle, roughness of the road surface, or the like.

Figure 11A:
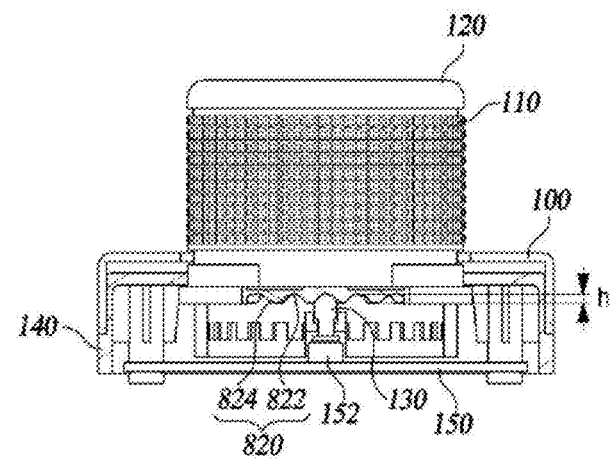
FIGS. 11A and 11B are cross-sectional views showing a process in which the push member of the multi-functional knob presses the push sensor according to an embodiment of this disclosure.
Figure 11B:
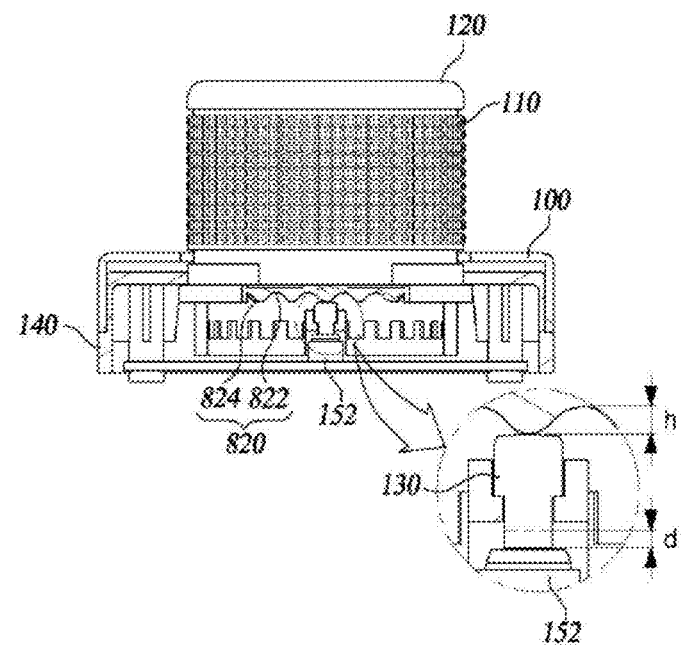

FIGS. 11A and 11B are cross-sectional views illustrating a process in which the push member 130 of the multi-functional knob presses the push sensor 152 according to an embodiment of the present disclosure.

Figure 12A:
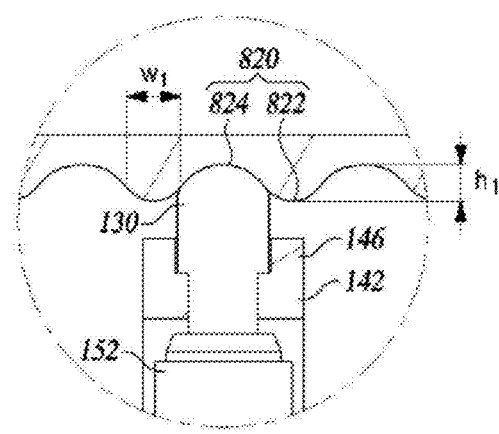
FIGS. 12A and 12B are enlarged cross-sectional views showing the shape of the push member and the rotary guide unit of the multi-functional knob according to an embodiment of the present disclosure.
Figure 12B:
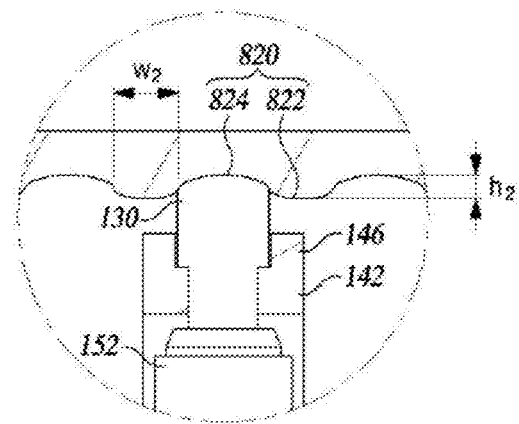

FIGS. 12A and 12B are enlarged cross-sectional views illustrating the shape of the push member 130 and the rotary guide unit 820 of the multi-functional knob according to an embodiment of the present disclosure.

Referring to FIGS. 11A, 11B, 12A and 12B, the rotary guide unit 820 may be configured to have a shape in which a plurality of troughs 822 and ridges 824 are repeated, and the push member 130 may be formed to have the shape corresponding to the ridges 824 of the rotational guide portion 810. When the push member 130 is configured to have the above-described shape, it is possible to prevent the push member 130 from being moved by itself due to vibration of the vehicle, roughness of the road surface, or the like in addition to the elastic force of the push sensor 152.

It is preferred that the number of the plurality of ridges 824 included in the rotary guide unit 820 is equal to that of a plurality of the uneven structures 800, and the plurality the ridges 824 of the rotary guide unit 820 are formed at positions corresponding to the positions where the plurality of uneven structures 800 are formed. This is because when the guide body unit 120 rotates, the amount of rotation intended by the user, i.e., the user feels and the input value sensed by the rotation sensor 154 are the same.

The number of troughs 822 and ridges 824 included in the rotary guide unit 820 and the number of the uneven structures 800 can be easily changed from the design perspective during fabrication, and can be tailored without any increase in a cost according to the desired number of revolutions by the user.

Conventional knobs use a plate spring to provide a good feel of rotary manipulation to the user, but this has had a problem that variation in the feel of rotation manipulation is intense depending on manufacturing tolerances of the plate spring, and it requires a separate component such as a plate spring. The multi-functional knob according to an embodiment of the present disclosure is formed as above with the rotary guide unit 820, so that it is possible to provide a good turning feel when the user turns the knob, without including a separate component.

Referring to FIG. 11A, when the user does not operate the multi-functional knob, the push member 130 abuts onto abutment with the ridge 824 of the rotary guide unit 820. Referring to FIG. 11B, when the user rotates the multi-functional knob, the push member 130 abuts onto the trough 822 of the rotary guide unit 820 before abutting on the next ridge 824 of the rotary guide unit 820. When the push member 130 abuts against the trough 822 of the rotary guide unit 820, the push member 130 pushes the push sensor 152 by height difference h formed by the valleys 822 and the ridges 824 of the rotary guide unit 820. Therefore, the height difference formed by the trough 822 and the ridge 824 of the rotary guide unit 820 is preferably configured to be shorter than or equal to an admittible maximum pressing length d.

Meanwhile, when the user rotates the multi-function knob, the push member 130 presses the push sensor 152, so that both the push sensor 152 and the rotation sensor 154 can obtain input values at the same time. Therefore, the controller included in the printed circuit board 150 may in this case be configured to convert only the input value by the rotation sensor 154 into an electrical signal. That is, when the multi-functional knob is rotated, even if the push sensor 152 obtains an input value, it is not converted into an electrical signal, so that an operation by the input value of the push sensor 152 does not occur. Further, the height difference formed by the plurality of valleys 822 and the ridges 824 may be made smaller than the minimum pressing length for the push sensor 152 to obtain the input value, so that when the multi-function knob is rotated, the push sensor 152 does not obtain the input value.

In addition, the height difference and the width of each of the plurality of ridges 824 and the trough 822 included in the rotary guide unit 820 can be easily changed at the time of manufacture, so that the user can adjust the desired rotary operating feeling without raising the manufacturer.

Referring to FIG. 12A, the height difference h1 between the ridge 824 and the trough 822 is formed to be relatively large, and width w1 of the trough 822 is defined to be relatively small for a user who desires a strong turning feel. When configured as such, the user may feel a strong sense of operation because it must apply a greater force, i.e., torque, to rotate the multifunction knob according to an embodiment of the present disclosure. Meanwhile, referring to FIG. 12B, height difference h2 between the ridge 824 and the trough 822 is made to be relatively small and the width w2 of the trough 822 is formed relatively wide for a user who wishes to have a weak turning feel. When configured as such, the user may feel a weak sense of operation because it has to apply a smaller force, i.e., torque, to rotate the multifunction knob according to an embodiment of the present disclosure.

As described above, the multi-functional knob according to an embodiment of the present disclosure is capable of both linear movement and rotational movement, and even one knob can perform various functions, for example, air conditioning control, volume control, radio frequency control, etc. in the vehicle. In addition, it is possible to provide a pressing manipulation feel and a rotating operation feel for the user without having any additional components, and a tolerance margin, i.e., a degree of freedom in design is large, so that the operational feel and the design can be changed according to the needs of the user without increasing a manufacturing cost. Therefore, according to an embodiment of the present disclosure, there is an effect of being able to provide a multi-function knob with improved ease of use and design freedom without an increase in manufacturing cost as compared with conventional knobs.

The foregoing description is merely illustrative of the teachings of the present embodiments, and various modifications and changes may be made without departing from the essential characteristics of the embodiments by those skilled in the art. Therefore, the present embodiments are not intended to limit the technical idea of the present embodiment, but are intended to be described, and the scope of the technical concept of this embodiment is not limited by this embodiment. The scope of protection of the present embodiment is to be interpreted by the following claims, and all technical ideas that fall within the equivalent scope thereof should be interpreted as included in the scope of the invention.

| Description of Code | |
|---|---|
| 10 multi-functional knob | 100 cover housing |
| 105 first assembly hole | 110 button unit |
| 115 second assembly hole | 120 guide body |
| 122 second hook assembly | 130 push member |
| 140 fixing housing | 142 movement preventing unit |
| 144 assembly groove | 145 first hook assembly |
| 146 movement preventing unit | 148 fixing hook |
| 150: printed circuit board | 152 push sensor |
| 156 bolt | 700 anti-shaking unit |
| 800 uneven structure | 820 rotary guide unit |
| 822 trough | 824 ridge |

What is claimed is:

1. A multi-functional knob comprising:
a button unit exposed to an outside and having a gripping circumferential surface;
a guide body unit of a hollow type, configured such that the button unit surrounds at least a portion thereof and is fixedly coupled to an outer surface thereof, wherein the guide body unit includes a plurality of rotary guide units arranged along a circumferential surface, and wherein at least a part of a push member slidably contacts the rotary guide units;
a fixing housing of a hollow type, at least partially surrounding the button unit and the guide body unit;
the push member assembled to the fixing housing and configured to move in a direction parallel to a longitudinal axis in response to movement of the guide body unit; and
a printed circuit board connected to the fixing housing.

2. The multi-functional knob of claim 1, wherein the button unit and the guide body unit are configured to be movable along a longitudinal direction of the multi-functional knob.

3. The multi-functional knob of claim 1, wherein the button unit and the guide body unit are configured to be movable in conjunction with each other along the longitudinal axis direction of the multi-function knob.

4. The multi-functional knob of claim 1, wherein the button unit and the guide body unit are rotatable about the longitudinal axis.

5. The multi-functional knob of claim 4, wherein the button unit and the guide body unit are configured to be rotatable in conjunction with each other.

6. The multi-functional knob of claim 1, wherein the printed circuit board includes:
- a push sensor for sensing movement in a direction parallel to the longitudinal axis of the push member; and
- a rotation sensor for sensing a rotational movement of the guide body unit.

7. The multi-functional knob of claim 6, wherein the guide body unit includes a plurality of uneven structures arranged along a circumferential direction at an end part of the guide body unit, and wherein the plurality of uneven structures are configured to block light generated from the rotation sensor.

8. The multi-functional knob of claim 6, wherein the push member is configured to overlap the push sensor by a predetermined length in a direction parallel to the longitudinal axis.

9. The multi-functional knob of claim 1, wherein each rotary guide unit is configured in a shape in which a plurality of troughs and ridges are repeated, and wherein the push member has a shape corresponding to one of the plurality of ridges of each rotary guide unit.

10. The multi-functional knob of claim 1, wherein the fixing housing includes a movement prevention unit configured to prevent the push member from moving in a direction other than the direction parallel to the longitudinal axis.

11. The multi-functional knob of claim 1, wherein the fixing housing includes a fixing hook that restrains a range in which the guide body unit is movable in a longitudinal direction, and wherein the guide body unit includes a contact curvature unit configured to at least partially point-contact the fixing hook.

12. The multi-functional knob of claim 11, further comprising a an anti-shaking unit disposed between the fixing hook and an abutting curved surface portion and configured to keep a rotation axis of the guide body unit constant, wherein the curved surface portion is configured to be at least partially in line contact with the anit-shaking unit.

13. The multi-functional knob of claim 1, further comprising a cover housing configured to cover at least a part of the outside of the fixing housing and to be fixed to the fixing housing.

14. A multi-functional knob comprising:
- a button unit exposed to an outside and having a gripping circumferential surface;
- a guide body unit of a hollow type, configured such that the button unit surrounds at least a portion thereof and is fixedly coupled to an outer surface thereof;
- a fixing housing of a hollow type, at least partially surrounding the button unit and the guide body unit;
- a push member assembled to the fixing housing and configured to move in a direction parallel to a longitudinal axis in response to movement of the guide body unit; and
- a printed circuit board connected to the fixing housing, wherein the printed circuit board includes:
  - a push sensor for sensing movement in a direction parallel to the longitudinal axis of the push member; and
  - a rotation sensor for sensing a rotational movement of the guide body unit.

15. A multi-functional knob comprising:
- a button unit exposed to an outside and having a gripping circumferential surface;
- a guide body unit of a hollow type, configured such that the button unit surrounds at least a portion thereof and is fixedly coupled to an outer surface thereof;
- a fixing housing of a hollow type, at least partially surrounding the button unit and the guide body unit;
- a push member assembled to the fixing housing and configured to move in a direction parallel to a longitudinal axis in response to movement of the guide body unit; and
- a printed circuit board connected to the fixing housing, wherein:
  - the fixing housing includes a fixing hook that restrains a range in which the guide body unit is movable in a longitudinal direction, and
  - the guide body unit includes a contact curvature unit configured to at least partially point-contact the fixing hook.

* * * * *